US006337260B1

(12) United States Patent
Ishida

(10) Patent No.: US 6,337,260 B1
(45) Date of Patent: Jan. 8, 2002

(54) USE OF KNOCKED-ON OXYGEN ATOMS FOR REDUCTION OF TRANSIENT ENHANCED DIFFUSION

(75) Inventor: Emi Ishida, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/667,602

(22) Filed: Sep. 22, 2000

Related U.S. Application Data

(60) Provisional application No. 60/155,565, filed on Sep. 24, 1999.

(51) Int. Cl.⁷ ............... H01L 21/322; H01L 21/335; H01L 21/8232; H01L 21/04
(52) U.S. Cl. .............. 438/471; 438/143; 438/510
(58) Field of Search ............... 438/471, 473, 438/143, 476, 510, 514, 528

(56) References Cited

U.S. PATENT DOCUMENTS

| 4,243,435 A | | 1/1981 | Barile et al. ............... 148/1.5 |
|---|---|---|---|
| 4,567,645 A | | 2/1986 | Cavanagh et al. ............. 29/576 |
| 5,244,821 A | | 9/1993 | Ham et al. ..................... 437/31 |
| 5,482,876 A | | 1/1996 | Hsieh et al. .................. 437/40 |
| 5,554,548 A | | 9/1996 | Sundaresan .................. 437/41 |
| 5,559,050 A | | 9/1996 | Alsmeier et al. ............. 437/45 |
| 5,585,286 A | * | 12/1996 | Aronowitz et al. ........... 437/24 |
| 5,648,673 A | | 7/1997 | Yasuda ........................ 257/382 |
| 5,670,391 A | | 9/1997 | Lim et al. ..................... 437/25 |
| 5,759,904 A | | 6/1998 | Dearnaley .................... 438/528 |
| 5,849,634 A | * | 12/1998 | Iwata .......................... 438/655 |
| 6,258,695 B1 | * | 7/2001 | Dunn et al. ................. 438/424 |
| 6,265,255 B1 | * | 7/2001 | Hsien .......................... 438/199 |

\* cited by examiner

Primary Examiner—John F. Niebling
Assistant Examiner—Angel Roman

(57) ABSTRACT

Transient enhanced diffusion (TED) of ion implanted dopant impurities within a silicon semiconductor substrate is eliminated or substantially reduced by displacing "knocked-on" oxygen atoms from an overlying oxygen-containing layer into the substrate by ion implantation. The "knocked-on" oxygen atoms getter silicon interstitial atoms generated within the substrate by dopant implantation, which are responsible for TED.

18 Claims, No Drawings

USE OF KNOCKED-ON OXYGEN ATOMS FOR REDUCTION OF TRANSIENT ENHANCED DIFFUSION

RELATED APPLICATIONS

This application claims priority from Provisional Application Serial No. 60/155,565 filed on Sep. 24, 1999 entitled: "USE OF "KNOCKED-ON" OXYGEN ATOMS FOR REDUCTION OR TRANSIENT ENHANCED DIFFUSION", the entire disclosure of which is hereby incorporated by reference herein.

FIELD OF THE INVENTION

The present invention relates to the field of semiconductor devices and semiconductor processing. More particularly, the present invention relates to methods of suppressing or eliminating transient enhanced diffusion (TED) of ion implanted dopant impurities in semiconductor substrates. Even more particularly, the present invention relates to reduction or elimination of TED of ion implanted p- or n-type dopant impurities in silicon semiconductor substrates.

BACKGROUND OF THE INVENTION

The escalating requirements for high density and performance associated with ultra-large-scale integration (ULSI) semiconductor devices require design features of 0.18 $\mu$m and below, such as 0.15 $\mu$m below, increased transistor and circuit speeds, high reliability, and increased manufacturing yield and throughput for economic competitiveness. The reduction of design features to 0.18 $\mu$m and below challenges the limitations of conventional semiconductor manufacturing techniques.

The abovementioned continuing trend toward greater microminiaturization of semiconductor devices has engendered a need for reduced junction depths of integrated circuit components, e.g., transistors, to between about 70–100 nm. A problem confronting the achievement of such shallow junction depths is transient enhanced diffusion ("TED"), i.e., redistribution of implanted dopant impurities during thermal annealing following ion implantation of the dopant.

In semiconductor device fabrication, dopant containing impurities, i.e., n- and/or p-type dopant impurities, are introduced into the semiconductor material to alter its electrical conductivity characteristics. A preferred technique for use in high-density integration semiconductor devices is ion implantation. During ion implantation, a beam containing ions is directed at the surface of the semiconductor substrate material (i.e., target). As the ions enter the substrate material, they collide with the atoms constituting the target material and come to rest at an average depth within the substrate. The average depth at which the implanted ions are distributed varies with the implant energy, size (i.e., radius) of the implanted species, and the target material. For a given target material and ion species, higher implantation energy generally corresponds to a deeper penetration of the ions into the material. The implantation dose (i.e., total number of ions entering the target material) is controlled by monitoring the ion current during implantation as well as the duration thereof.

However, ion implantation incurs undesirable side effects. For example, during implantation the impinging ions displace target atoms, thereby creating damage in the crystal lattice structure of the target. Such damage typically is in the form of vacancies (i.e., holes or vacant lattice sites) and interstitials (i.e., atoms occupying interstices between normal lattice sites), which are referred to as point defects. In extreme instances, the lattice damage is severe enough to transform the semiconductor target into an amorphous material.

As for silicon target material, ion implantation is the preferred technique for introducing p- and n-type dopant species, such as boron and phosphorus, respectively. The atomic collisions which occur during the implantation process create large numbers of the above-described point defects, including silicon interstitials produced by displacement of silicon atoms from their normal sites in the crystal lattice. Some of these defects agglomerate into small extended defects, such as rod-like interstitial defects that tend to orient along the (113) crystal direction. During the post-implantation thermal annealing step, the silicon interstitials ($Si_I$) that are released from such agglomerates promote a rapid redistribution of the implanted dopant atoms, particularly p-type boron atoms. Redistribution occurs because silicon interstitials interact with substitutional boron atoms, thereby replacing the boron atoms and resulting in highly mobile boron interstitials ($B_I$). The resulting redistribution of dopant caused by an increase in the effective diffusion rate of the dopants during the first few seconds of thermal annealing treatment is known as TED. In some instances, TED increases the diffusion rate by a factor of 10 to 100.

TED makes it difficult, if not impossible, to control implanted boron depth distribution in silicon targets. As a consequence, p-junction depth cannot be controlled by simply reducing the boron ion implantation energy (and thus the range of ion penetration into the silicon crystal lattice). Moreover, high temperature cycles, such as are encountered during annealing for activation of implanted dopant and lattice damage relaxation, can cause appreciable diffusion of the dopants, thereby significantly altering the dopant impurity concentration profiles, which effects are disadvantageously exacerbated by TED. Moreover, with the reduction of device sizes to the submicron range, there is a further need for close control of dopant diffusion. Techniques such as rapid thermal annealing (RTA) have been used to reduce undesirable diffusion of dopants during repair of implant damage. RTA refers to various techniques for heating the implanted target material for short periods of time, e.g., on the order of seconds.

However, even when RTA is utilized, TED has been observed during the post-implant annealing process. As indicated above, TED makes it difficult to control the implant profile. In the past, this was not a significant concern because the diffusion of dopants attributable to TED was considered to be within tolerable limits. But as technology now enables reduction of device sizes to below submicron dimensions, the effects of TED have become more pronounced and cannot be disregarded. For example, in MOS devices, lateral diffusion of the source and drain implants adversely affects the threshold-adjust implant at the gate region even though these regions are separated by, for example, several tenths of a micron. This results in an increase in gate threshold voltage $V_T$ which controls the conduction path between the source and drain as device size decreases (i.e., reverse short-channel effect). TED also causes impurity atoms to accumulate at the target surface in high concentration. This accumulation degrades channel mobility as it inhibits the movement of electrons between the source and the drain, thereby decreasing the speed of the resultant device. In addition, submicron-dimensioned devices require ultra-shallow junctions having depths of, e.g., less than 1000 Å to maintain low contact resistance. Vertical diffusion of dopants resulting from TED makes it difficult to achieve the shallow implant profiles necessary for such devices.

U.S. Pat. No. 5,670,391 issued Sep. 23, 1997 is directed to a process for fabricating a semiconductor device which includes a step for reducing the enhanced diffusion of dopant atoms that occurs during post-implant anneal. Prior to annealing the substrate wafer, the surface of the ion implanted region is etched to bring it closer to the level of the implant damage. The etch process is preferably controlled to prevent etching the surface significantly beyond the peak of the dopant concentration profile in order to avoid removing a significant portion of the implanted dopant. By bringing the implanted surface closer to the implant damage, the effects of TED during post-implant annealing are reduced.

U.S. Pat. No. 5,759,904 issued Jun. 2, 1998 discloses a method for suppressing TED of ion-implanted dopants in a semiconductor substrate comprising bombarding the substrate in a vacuum with a beam of bubble-forming ions at a first temperature, a first energy, and a first ion dose sufficient to form a dispersion of bubbles at a depth equivalent to a peak of lattice damage distribution in the substrate from implantation of dopant ions into the substrate in a vacuum at a second temperature, a second energy, and a second ion dose, the dispersion of bubbles being sufficient to reduce TED of the implanted dopant without inducing additional lattice damage in the substrate.

U.S. Pat. No. 5,559,050 issued Sep. 24, 1996 discloses a process for forming P-MOSFETS with enhanced anomalous narrow channel effect, comprising a step of performing an annealing step between a deep phosphorus implantation and growth of the gate oxide. The annealing step, performed at 800° C. for 60 minutes, provides for rapid excess interstitial recombination at $Si/SiO_2$ interfaces, thereby reducing TED of boron during the gate oxidation.

In view of the above, there exists a clear need for a rapid, simple, cost-effective method for eliminating or substantially reducing TED of implanted dopants during post-implantation thermal annealing of semiconductor materials, which method is fully compatible with the requirements of conventional process flow and manufacturing throughput, and provides increased product yield of submicron-dimensioned semiconductor devices.

DISCLOSURE OF THE INVENTION

An advantage of the present invention is an improved method for eliminating or substantially reducing TED of ion-implanted semiconductor materials.

Another advantage of the present invention is an improved method for eliminating or substantially reducing TED of ion-implanted dopants in silicon semiconductor substrates.

Still another advantage of the present invention is an improved ion-implanted monocrystalline silicon wafer substrate which experiences no or a substantially reduced amount of TED upon post-implantation thermal annealing processing.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of reducing TED of ion implanted dopant impurities within a semiconductor substrate, which method comprises introducing oxygen atoms into the substrate from an oxygen-containing layer overlying an implanted surface of the substrate for gettering interstitial defects within the substrate responsible for the TED.

In embodiments according to the present invention, the oxygen atoms introduced into the substrate comprise "knocked-on" atoms displaced from the oxygen-containing layer by ion bombardment; the ion bombardment preferably comprises implantation of ions into the oxygen-containing layer; and the thickness of the oxygen-containing layer and implantation species, dosage, and energy are selected for optimizing the displacement of oxygen atoms therefrom for supplying the substrate with oxygen atoms for gettering of interstitial defects.

In further embodiments according to the present invention, ion implantation into the oxygen-containing layer for displacement of oxygen atoms therefrom comprises implantation of n- or p-type dopant impurities typically selected from boron-, phosphorus-, arsenic-, and antimony-containing ions, which dopant impurities can be implanted into the oxygen-containing layer for displacing oxygen atoms therefrom simultaneously with implantation thereof into the semiconductor substrate for formation of a shallow junction therein. Alternatively, implantation of the dopant impurities into the oxygen-containing layer can be performed prior or subsequent to implantation of the dopant impurities into the semiconductor substrate for formation of a shallow junction therein.

In still further embodiments according to the present invention, ion implantation into the oxygen-containing layer for displacement of oxygen atoms therefrom comprises implantation of inert ions typically selected from germanium and silicon-containing ions; and the inert ions can be implanted in the oxygen-containing layer prior or subsequent to implantation of dopant impurities into the semiconductor substrate for formation of a shallow junction therein.

In preferred embodiments according to the present invention, the semiconductor substrate comprises a monocrystalline silicon wafer, the interstitial defects comprise interstitial silicon atoms, the oxygen-containing layer comprises a silicon oxide screen layer having a preselected thickness, and the silicon oxide screening layer is implanted with ions at a preselected dosage and energy to supply the silicon substrate with a sufficient quantity of "knocked-on" oxygen atoms displaced therefrom.

According to another aspect of the present invention, ion-implanted, doped monocrystalline silicon wafer substrates comprising a shallow junction depth below the wafer surface and having no or substantially reduced TED of the dopant species, are provided.

Additional advantages and aspects of the present invention will become readily apparent to those skilled in the art from the following detailed description, wherein only the preferred embodiment of the present invention is described, simply by way of illustration of the best mode contemplated for carrying out the method of the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

DESCRIPTION OF THE INVENTION

The present invention fully addresses and solves the above-mentioned problems and drawbacks attendant upon conventional ion implantation/thermal annealing processing resulting from TED affects, and is of particular utility in the fabrication of high-density semiconductor integrated circuit devices comprising submicron-dimensioned features, including, inter alia, MOS and/or CMOS transistors. Briefly stated, according to the present invention, TED of implanted dopant impurities in a semiconductor substrate is substantially reduced or eliminated by introducing oxygen atoms into the substrate from an oxygen-containing layer overlying the implanted surface of the semiconductor substrate, which oxygen atoms getter interstitial defects, such as interstitial silicon atoms, responsible for the TED. Embodiments of the present invention comprise introducing oxygen atoms into the semiconductor substrate, which oxygen atoms are "knocked-on" atoms displaced from an oxide layer, e.g., a silicon oxide layer, by ion bombardment/implantation. The thickness of the oxide layer and the implantation species, dosage, and energy are selected for optimizing the displacement of oxygen atoms from the oxide layer. The implanted ions may comprise an inert species or a dopant species. In the former case, ion implantation of the oxide layer for displacing "knocked-on" oxygen atoms therefrom for entry into the underlying semiconductor substrate may be performed prior or subsequent to dopant ion implantation into the semiconductor substrate for shallow junction formation therein. In the latter case, implantation into the oxide layer may be performed simultaneously with, prior, or subsequent to dopant ion implantation into the substrate for shallow junction formation therein.

An illustrative, but non-limitative embodiment of the present invention will now be described with specific reference to silicon semiconductor substrates. However, it is to be understood that the invention is not limited to the use of silicon semiconductor substrates, e.g., the principles of the invention are applicable to other semiconductor materials, including, but not restricted to, gallium arsenide and other III-V compound semiconductors.

It is recognized that, for a particular semiconductor substrate material, TED of ion implanted dopant impurities is largely attributable to a specific type of defect, e.g., silicon interstitial atoms in the case of silicon substrates, which interstitials are created during the dopant ion implantation process and constitute one aspect of implantation-generated lattice damage. In addition, certain atomic species, when present in a semiconductor material, have the ability to selectively inactivate, or "getter" specific impurities or defects within the semiconductor. For example, oxygen atoms present in crystalline silicon substrates are known to getter defects such as interstitial silicon atoms ($Si_I$), which in turn, are known to be the primary cause of TED of n- and/or p-type dopant impurities contained in the silicon lattice, e.g., boron ions, phosphorus ions, etc.

In accordance with the present invention, oxygen atoms are selectively displaced from an oxygen-containing layer overlying a dopant ion implanted surface of a semiconductor substrate and enter into the substrate, which displaced oxygen atoms getter interstitial defects present in the semiconductor substrate as a result of dopant ion implantation for forming a shallow junction therein, thereby eliminating or substantially reducing TED of the ion implanted dopant impurities.

Embodiments of the present invention include ion bombarding a conventional screen layer formed over and in contact with a surface of a semiconductor substrate to displace oxygen atoms into the substrate prior to ion implantation thereof for introducing dopant impurities therein, e.g., for shallow junction formation.

In utilizing silicon substrates, a silicon oxide film, i.e., an oxygen-containing film, is typically formed as a protective or "screening," film on the substrate surface, inter alia, to prevent or alleviate roughening and lattice damage thereof as a result of the ion implantation, prevent channeling of the implanted ions, and absorb contaminant ions, e.g., metal ions sputtered or otherwise dislodged from the walls of the implantation apparatus. However, ion implantation into and/or through such oxide screening film typically results in the displacement of oxygen atoms from the oxide film and their concomitant movement into the underlying semiconductor substrate due to a momentum transfer process, termed "knock-on". The amount of "knocked-on" oxygen atoms entering the underlying semiconductor substrate and the depth they can attain are proportional to the implantation dose and energy, respectively. In addition, the quantity of "knocked-on" oxygen atoms increases with the thickness of the oxide layer and the mass of the bombarding ions.

The present invention utilizes the above-described "knock-on" phenomenon to purposefully introduce oxygen atoms into a dopant ion-implanted semiconductor substrate from a surface oxide layer, e.g., a conventional screen oxide layer, for gettering interstitial defects, typically interstitial silicon atoms, present in the semiconductor substrate as a consequence of the dopant ion implantation, thereby substantially reducing or eliminating TED of the implanted dopant impurity ions which would otherwise result from the presence of the interstitial defects. The inventive method further comprises selecting the thickness of the oxygen-containing layer and the implantation species, dosage, and energy for optimizing the displacement of oxygen atoms therefrom for supplying same to an underlying semiconductor substrate at a concentration level sufficient for use in a specific device application requiring a particular shallow junction depth.

According to an embodiment of the present invention, ion implantation into the oxygen-containing layer for displacement of oxygen atoms therefrom via the "knock-on" phenomenon and their introduction into to the underlying semiconductor layer comprises implantation of n- or p-type dopant impurities typically selected from boron-, phosphorus-, arsenic-, and antimony-containing ions, the particular dopant species, dosage, and energy being selected in conjunction with the oxygen-containing layer thickness for supplying the underlying semiconductor substrate with an amount of displaced oxygen atoms sufficient for creating a preselected concentration of the displaced oxygen atoms for a preselected depth below the surface of the semiconductor surface subjected to dopant ion implantation for shallow junction formation.

In a variation of this embodiment, the implantation energy is selected such that the dopant impurities for displacing oxygen atoms from the oxygen-containing layer are simultaneously implanted through the oxygen-containing layer and into the underlying substrate for forming the shallow junction therein.

In another variation of this embodiment, implantation of the dopant impurities into the semiconductor substrate for forming the shallow junction therein is performed prior to implantation of the oxygen-containing layer with dopant impurities for displacing oxygen atoms therefrom. In a further variation, implantation of dopant impurities for shallow junction formation is performed subsequent to implantation of dopant impurities for oxygen atom displacement. It should be understood that selective implantation of either the semiconductor substrate or the oxygen-containing layer, or simultaneous implantation of both, can be accomplished by appropriate selection of the implantation parameters, principally implantation energy.

According to another embodiment of the present invention, ion implantation of the oxygen-containing layer for displacement of oxygen atoms therefrom via the "knock-on" phenomenon and introduction thereof to the underlying semiconductor substrate comprises implantation of inert ions, e.g., typically silicon- or germanium-containing ions for use with silicon substrates. In a variation of this embodiment, inert ion implantation is performed prior to implantation of dopant ions into the underlying substrate for shallow junction formation therein. In another variation of this embodiment, inert ion implantation is performed subsequent to implantation of dopant ions into the underlying substrate for shallow junction formation therein. In either variation, the parameters for the inert ion implantation step. e.g., implantation energy, are appropriately selected so as to limit implantation to the oxygen-containing layer.

The present invention is applicable to the manufacture of various types of semiconductor devices, and has particular utility in the manufacture of high density integration semiconductor devices having a design rule of about 0.18 $\mu$m and below and shallow junction depths.

The present invention can be practiced by employing conventional materials, methodology, and equipment. Accordingly, the details of such conventional materials, methodology, and equipment are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures etc., have not been described in detail, in order not to unnecessarily obscure the present invention.

Only the preferred embodiment(s) of the present invention and but a few examples of its versatility are shown and described in the present disclosure. It is to be understood that the present invention is capable of use in various other combinations and environments and is capable of chances or modifications within the scope of the inventive concept as expressed herein.

What is claimed:

1. A method of reducing transient enhanced diffusion (TED) of ion implanted dopant impurities within a semiconductor substrate, which method comprises introducing oxygen atoms into said substrate from an oxygen-containing layer overlying an ion implanted surface of said substrate for gettering interstitial defects within said substrate responsible for said transient enhanced diffusion.

2. The method as in claim 1, comprising bombarding said oxygen-containing layer with ions to displace "knocked-on" oxygen atoms from said oxygen-containing layer.

3. The method as in claim 2, comprising ion implanting dopant impurities to displace of oxygen atoms from the oxygen-containing layer into said substrate.

4. The method as in claim 3, further comprising simultaneously implantating said dopant impurities into said semiconductor substrate for forming a shallow junction therein.

5. The method as in claim 3, comprising implanting said dopant impurity into said oxygen-containing layer prior to implanting said dopant impurities into said semiconductor substrate for forming a shallow junction therein.

6. The method as in claim 3, comprising implanting said dopant impurity implantation into said oxygen-containing layer subsequent to implantating said dopant impurities into said semiconductor substrate for forming a shallow junction therein.

7. The method as in claim 3, wherein said dopant impurities are selected from boron-, arsenic-, antimony-, and phosphorus-containing ions.

8. The method as in claim 2, comprising implanting inert ions into said oxygen-containing layer to displace of oxygen atoms therefrom.

9. The method as in claim 8, comprising implanting said inert ions into said oxygen-containing layer prior to implanting said dopant impurities into said semiconductor substrate for forming a shallow junction therein.

10. The method as in claim 8, comprising implanting inert ions into said oxygen-containing layer subsequent to implantating said dopant impurities into said semiconductor substrate for forming a shallow junction therein.

11. The methods as in claim 8, wherein said inert ions are selected from germanium- and silicon-containing ions.

12. The method as in claim 2, wherein said semiconductor substrate comprises a monocrystalline silicon wafer and said interstitial defects comprise interstitial silicon atoms.

13. The method as in claim 12, wherein said oxygen-containing layer comprises a silicon oxide layer.

14. The method as in claim 13, wherein said silicon oxide layer is a screen oxide layer.

15. The method as in claim 14, comprising implanting ions into said silicon oxide layer at a preselected dosage and energy to displace "knocked-on" oxygen atoms therefrom into said silicon substrate.

16. A method of reducing transient enhanced diffusion (TED) of ion implanted dopant impurities within a monocrystalline silicon substrate, which method comprises:

forming a silicon oxide layer overlying an ion implanted surface of said substrate; and ion implanting the silicon oxide layer to displace "knocked-on" oxygen atoms therefrom into the substrate for gettering of interstitial silicon atoms within said substrate responsible for said transient enhanced diffusion.

17. The method as in claim 16, wherein said silicon oxide layer is a screen oxide layer and said ion implanting for displacing "knocked-on" oxygen atoms therefrom comprises implanting dopant atoms selected from boron-, arsenic-, antimony-, and phosphorus-containing ions or inert ions selected from germanium- and silicon-containing ions.

18. The method as in claim 17, further comprising forming an ion implanted shallow junction within said silicon substrate.

* * * * *